United States Patent [19]

Izawa et al.

[11] Patent Number: 5,138,239
[45] Date of Patent: Aug. 11, 1992

[54] VERTICAL AMPLIFIER APPARATUS WITH A BEAM-FINDING FUNCTION FOR AN OSCILLOSCOPE

[75] Inventors: Masao Izawa; Hidenori Tomishima, both of Kawasaki, Japan

[73] Assignee: Kikusui Electronics Corporation, Kawasaki, Japan

[21] Appl. No.: 777,180

[22] Filed: Oct. 16, 1991

[30] Foreign Application Priority Data

Oct. 18, 1990 [JP] Japan .................. 2-277849

[51] Int. Cl.⁵ .................. H01J 29/70; H01J 29/72
[52] U.S. Cl. .................. 315/396
[58] Field of Search .............. 315/396, 397; 358/67, 358/68, 69

[56] References Cited

U.S. PATENT DOCUMENTS

| | | | |
|---|---|---|---|
| 3,689,752 | 9/1972 | Gilbert | 364/841 |
| 3,949,317 | 4/1976 | Crosby | 307/567 |
| 4,224,556 | 9/1980 | Muto | 315/396 |
| 4,677,340 | 6/1987 | Miller et al. | 358/69 |

Primary Examiner—Theodore M. Blum
Attorney, Agent, or Firm—Finnegan, Henderson, Farabow, Garrett & Dunner

[57] ABSTRACT

A vertical amplifier apparatus with a beam-finding function for an oscilloscope including an analog multiplier and a gain control circuit. The analog multiplier multiplies an input signal to the vertical amplifier by a gain control signal. The gain control circuit outputs a DC voltage as the gain control signal. In a beam-finding mode, the gain control circuit supplies the analog multiplier with the gain control signal whose absolute value is much smaller than that of the gain control signal in a normal mode. This makes is possible to obviate a dedicated beam-finder circuit. In a multi-channel oscilloscope, the beam-finding operation can be performed independently for each channel.

9 Claims, 4 Drawing Sheets

VERTICAL AMPLIFIER APPARATUS WITH A BEAM-FINDING FUNCTION FOR AN OSCILLOSCOPE

BACKGROUND OF THE INVENTION

1. Field of the Invention

The present invention relates to a vertical amplifier apparatus with a beam-finding function for an oscilloscope.

2. Description of the Prior Art

In general, there is a case where an input signal for an oscilloscope, which includes a large DC offset value for the vertical input range, disappears beyond the display range. In this case, the observer utilized the beam-finding function to check the input signal for a plus or minus DC offset.

FIG. 1 is a block diagram showing schematic arrangement of a two quadrant oscilloscope. Each channel includes an attenuator 31, a position controller 32, a vertical amplifier 33. As a common stage, there are provided a multiplexer 34, a final stage amplifier 35 and a CRT 36 (Cathod Ray Tube). Here, the vertical amplifier 33 includes an input feedback amplifying state 33a and an output feedback amplifying stage 33b, which will be described later. the gain of the vertical amplifier can be adjusted by varying the volume of a variable resister 33c included in the amplifier 33. In the conventional oscilloscope, a beam-finder circuit 37 is connected to the final stage amplifier 35. The operation of this circuit will be described.

Transistors Q41 and Q42, and resistors R41 and R42 constitute a differential feedback amplifier of the final state amplifier 35, and a transistor Q43 and resistors R44 and R45 constitute the beam-finder circuit 37. The base of the transistor Q43 of the beamfinder circuit 37 normally controlled so as to close the transistor Q43, and therefore, the mixed emitter current of the transistors Q41 and Q42 flows through the resistors R43 and R44 connected in parallel. In the beam-finding operation, the emitter current flows only through the resistor 43 because the transistor Q43 is opened, and therefore, the gain decreases with the emitter current which is less than that of normal operation. Supposing the resistance value of the resistor R3 is much smaller than that of the resistor R44, the difference of the gain between in the normal operation and in the beam-finding operation will increase. In this way, the gain of the final stage amplifier can be decreased. As a result, the input signal wave, which is beyond the display range of CTR 36, is reduced to be displayed within the range. Furthermore, the Z axis (brightness) is controlled at the same time. The reason why the Z axis if controlled is that the rough condition of the input signal in the beam-finding operation ca ben checked by increasing the brightness even if no trigger is applied in the trigger sweep mode.

In such a conventional circuit, the beam-finder circuit 37 is connected to the amplifier 35 which is connected to the output of the multiplexer 34. When the beam-finder circuit 37 is actuated while a plurality of input signals are applied, gains of both vertical axis and horizontal axis are uniformly reduced for all the input signals by controlling the amplification of the final state amplifiers by using the beam-finder circuit. For this reason, the beam-finding function cannot be independently applied to each channel. In order to solve this problem in the conventional circuit, the vertical amplifier 33 of each channel must be provided with a resistor for reducing the amplification of the vertical amplifier 33. This solution, however, presents such a new problem that the component number of the beam-finder circuit increases and the manufacturing cost is raised.

SUMMARY OF THE INVENTION

It is therefore an object of the present invention to provide a vertical amplifier apparatus with a beam-finding function for an oscilloscope that enables the beam-finding operation for each channel independently without adding a dedicated circuit for the beam-finding operation.

In a first aspect of the present invention, a vertical amplifier apparatus with a beam-finding function for an oscilloscope comprises:

an analog multiplexer for multiplying an input signal to the vertical amplifier by a gain control signal; and gain control means for outputting a DC voltage as the gain control signal, the gain control means supplying, in a beam-finding mode, the analog multiplier with the gain control signal whose absolute value is smaller than that of the gain control signal in a normal mode in which an input signal is displayed to be observed.

Here, the analog multiplier may be a doubly balanced differential amplifier.

The gain control means may be connected to a manually operated beam-finder switch, and outputs the gain control signal of a small absolute value when the beam-finder switch is activated.

The vertical amplifier may further comprise an input stage amplifier whose output is connected to an input of said analog multiplier, and an output stage amplifier whose input is connected to an output of the analog multiplier.

In a second aspect of the present invention, a vertical amplifier apparatus with a beam-finding function for an oscilloscope comprises:

a plurality of vertical amplifiers, each of which is provided corresponding to each one of multiple channels of the oscilloscope, each of the plurality of vertical amplifiers including:

an analog multiplier for multiplying an input signal to the vertical amplifier by a gain control signal; and gain control means for outputting a DC voltage as the gain control signal, the gain control means supplying, in a beam-finding mode, the analog multiplier with the gain control signal whose absolute value is smaller than that of the gain control signal in a normal mode in which an input signal is displayed to be observed.

Here, the gain control means may be independently provided for each of the multiple channels.

The analog multiplier may be a doubly balanced differential amplifier.

Each of the gain control means may be connected to a manually operated beam-finder switch so as to output the gain control signal of a small absolute value when the beam-finder switch is activated.

The vertical amplifier may further comprise an input stage amplifier whose output is connected to an input of the analog multiplier, and an output stage amplifier whose input is connected to an output of the analog multiplier.

The present invention supplies a DC voltage for gain control to the analogue multiplier as the vertical amplifier which is provided for each channel. In the beam-finding mode, the DC voltage for the gain control, which is lower than that in the normal operation, is supplied to the analogue multiplier so that the gain of the analogue multiplier sharply decrease. Thus, the beam-finding function for each channel can be achieved. The above and other objects, effects, features and advantages of the present invention will become more apparent from the following description of an embodiment thereof taken in conjunction with the accompanying drawings.

DETAILED DESCRIPTION OF PREFERRED EMBODIMENTS

The present invention employs a high performance analogue multiplier, which is manufacturered for the wide band high frequency use based on the remarkable development of the semi-conductor technology, as a vertical amplifier of an oscilloscope.

The invention will now be described with reference to the accompanying drawings.

Figure 1:
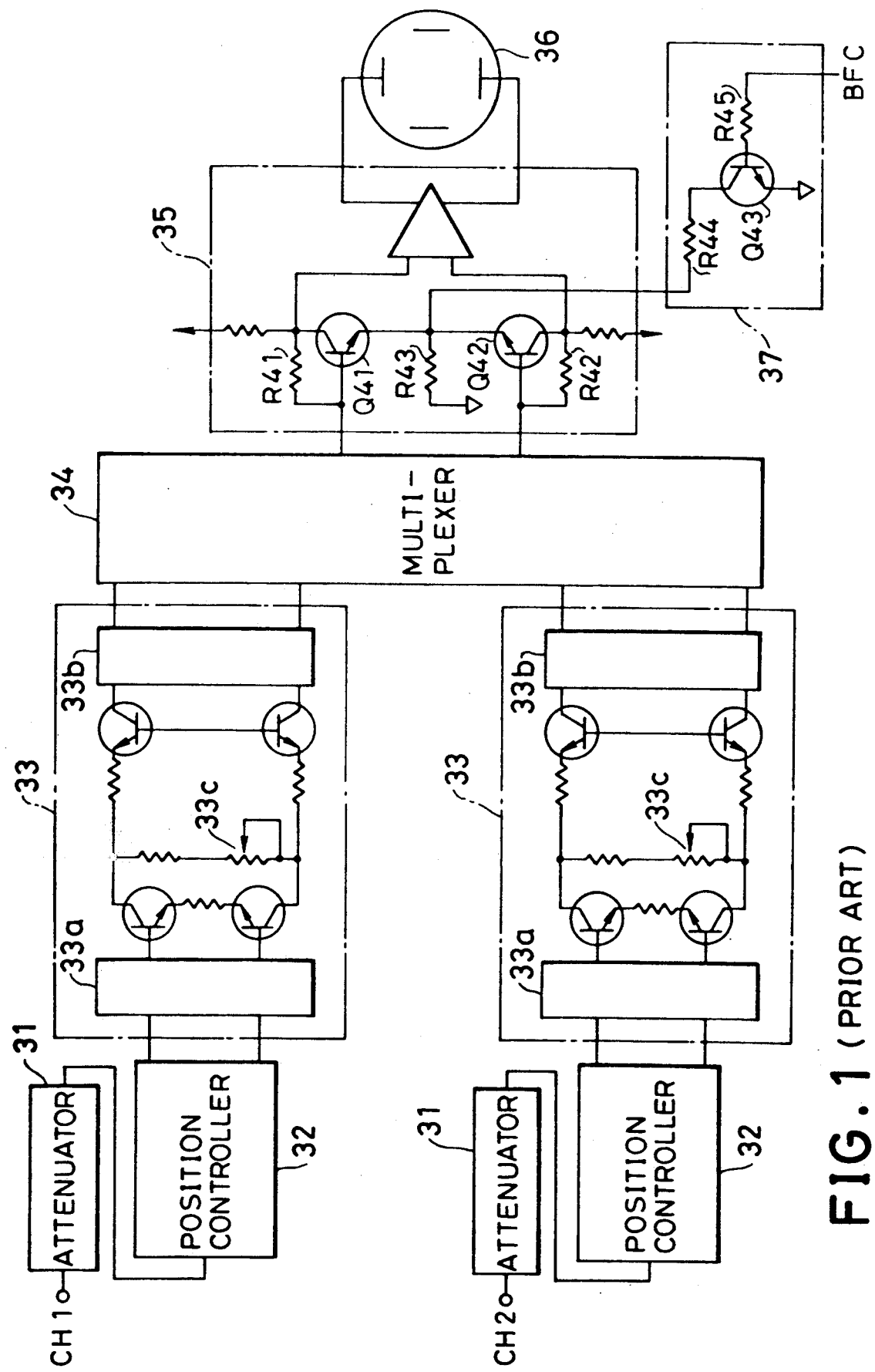
FIG. 1 is a block diagram showing a schematic arrangement of a conventional two quadrant oscilloscope including a beam-finder circuit.
Figure 2:
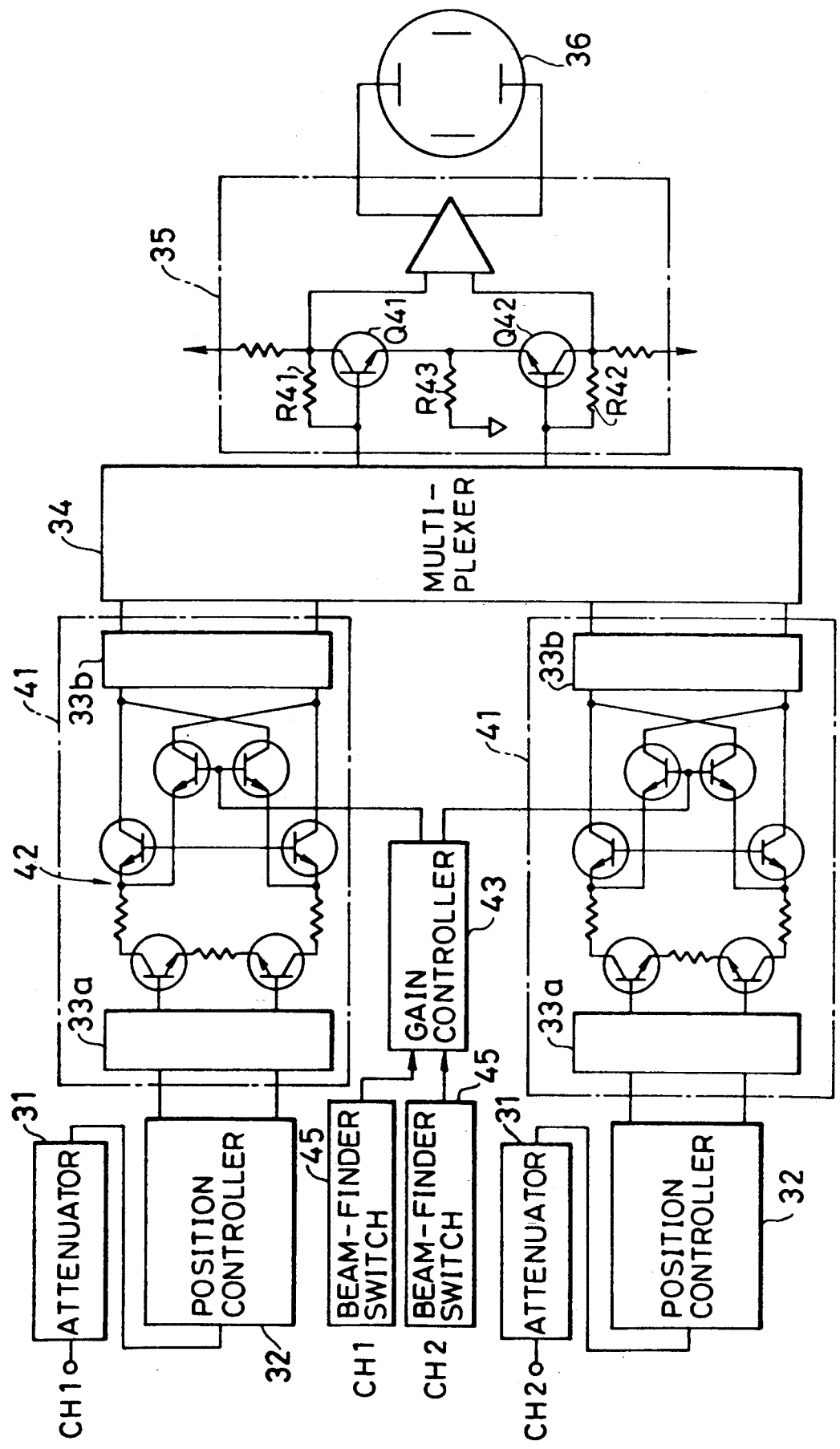
FIG. 2 is a block diagram showing an arrangement of a two quadrant oscilloscope including an embodiment of a vertical amplifier apparatus with a beam-finding function for an oscilloscope according to the present invention.

FIG. 2 is a block diagram showing an arrangement of a two quadrant oscilloscope including an embodiment of a vertical amplifier with a beam-finding function according to the present invention. This embodiment differs from the conventional circuit shown in FIG. 1 in the following two points.

(1) An arrangement of a vertical amplifier 41 is different from that of the conventional vertical amplifier 33 in FIG. 1 in that the amplifier 41 includes a multiplier in the form of a doubly balanced differential amplifier 42.

(2) The beam-finder circuit 37 of FIG. 1 is removed in the embodiment.

The beam-finding function of the embodiment is integrally incorporated into the doubly balanced differential amplifier 42, and is controlled by a control signal supplied from a gain controller 43 which is connected to a beam-finder switch 456 provided for each channel.

For this reason, the operation principle of the doubly balanced differential amplifier (a four quadrant analogue multiplier) used in the embodiment will be described with reference to FIG. 3.

Figure 3:
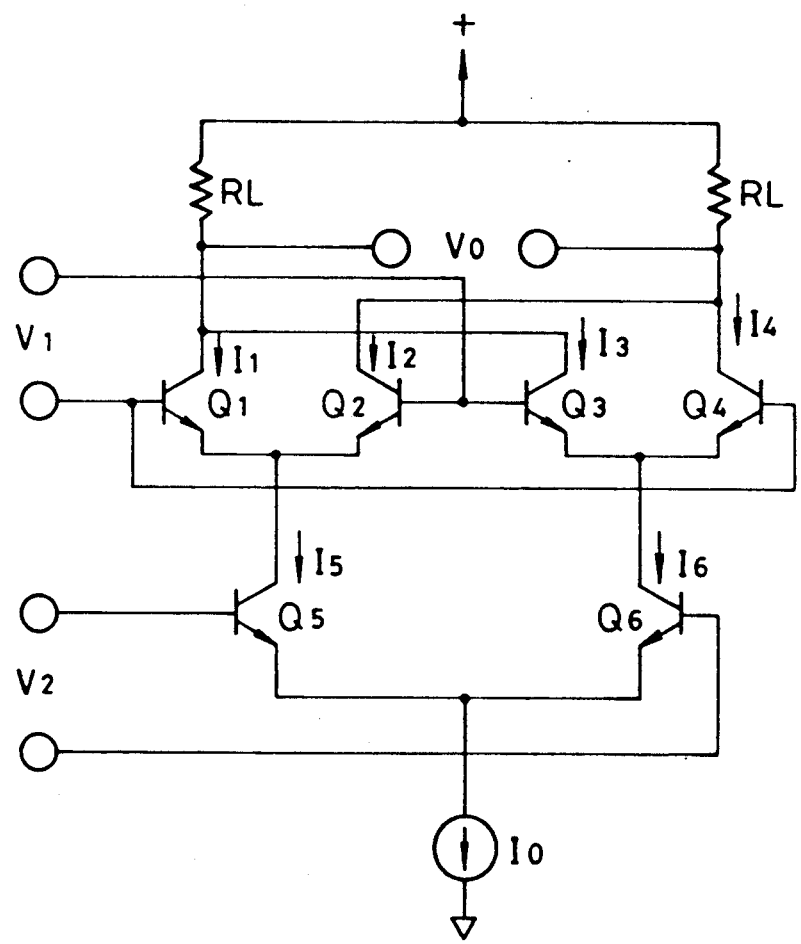
FIG. 3 is a schematic diagram showing an arrangement of a doubly balanced differential amplifier used in the vertical amplifier of FIG. 2.

In FIG. 3, RL denotes load resistors; Q1 to Q6 designate transistors; I1 to I6 denote currents flowing through the transistors Q1 to Q6, respectively, Vo designates an output voltage, and V1 and V2 denote input voltages. Supposing that the conductance of a transistor, which is written as gm(IX), is the function of current Ix, the currents I5 and I6 of the respective transistors Q5 and Q6 are given by $$I5 = Io/2 + gm(Io)V2 \quad (1)$$

$$I6 = Io/2 + gm(Io)V2 \quad (2)$$

And also, the currents I1 to I4 are given by $$I1 = I5/2 - gm(I5)V1 \quad (3)$$

$$I2 = I5/2 + gm(I5)V1 \quad (4)$$

$$I3 = I6/2 + gm(I6)V1 \quad (5)$$

$$I4 = I6/2 - gm(I6)V1 \quad (6)$$

The currents of the resistors RL connected to the transistor Q1 and Q4 are I1+I3 and I2+I4, respectively.

Then the output voltage Vo is given by $$Vo = RL(I1 + I3 - I2 - I4) \quad (7)$$

Substituting equations (3) to (6) into the equation (7), the voltage Vo is obtained as $$Vo = \{-2gm(I5)V1 + 2gm(I6)V1\}RL \quad (8)$$

Here, the conductances gm(I5) and gm(I6) are defined as $$gm(I5) = q \cdot a \cdot I5/4kT \quad (9)$$
$$= (q \cdot a/4kt)\{Io/2 + gm(Io)V2\}$$

$$gm(I6) = q \cdot a \cdot I6/4kT \quad (10)$$
$$= (q \cdot a/4kt)\{Io/2 + gm(Io)V2\}$$

Where $a$ is the current gain of a common-base transistor; q is the magnitude of electronic charge, k is the Borzmann constant, and T is absolute temperature. Substituting equations (1) and (2) into equations (9) and (10), respectively, gm(I5) and gm(I6) are obtained by $$gm(I5) = (q \cdot a/4kT)\{Io/2 + gm(Io)V2\} \quad (11)$$

$$gm(I6) = (q \cdot a/4kT)\{Io/2 + gm(Io)V2\} \quad (12)$$

Furthermore, substituting equations (11) and (12) into equation (8), the voltage Vo is obtained as $$Vo = (q \cdot a/2kT)gm(Io)V1 \cdot V2 \cdot RL \quad (13)$$
$$= \{a^2/8 (kT/q)^2\}Io \cdot RL \cdot V1 \cdot V2$$

Equation (13) is simplified as $$Vo = KV \cdot V1 \cdot V2 \quad (14)$$

where k is a constant.

Therefore, the doubly balanced differential amplifier shown in FIG. 3 operates so that the output voltage is changed in proportion to the product of two input voltages. When the doubly balanced differential amplifier as mentioned above is used for a vertical amplifier, and when it is specified that voltage V2 is an input signal, voltage V1 is a gain control signal and voltage Vo is an output signal, the gain of the vertical amplifier can be controlled freely by varying the gain control voltage V1. Furthermore, the vertical amplifier can function as the beam-finder circuit by decreasing the gain close to zero.

Figure 4:
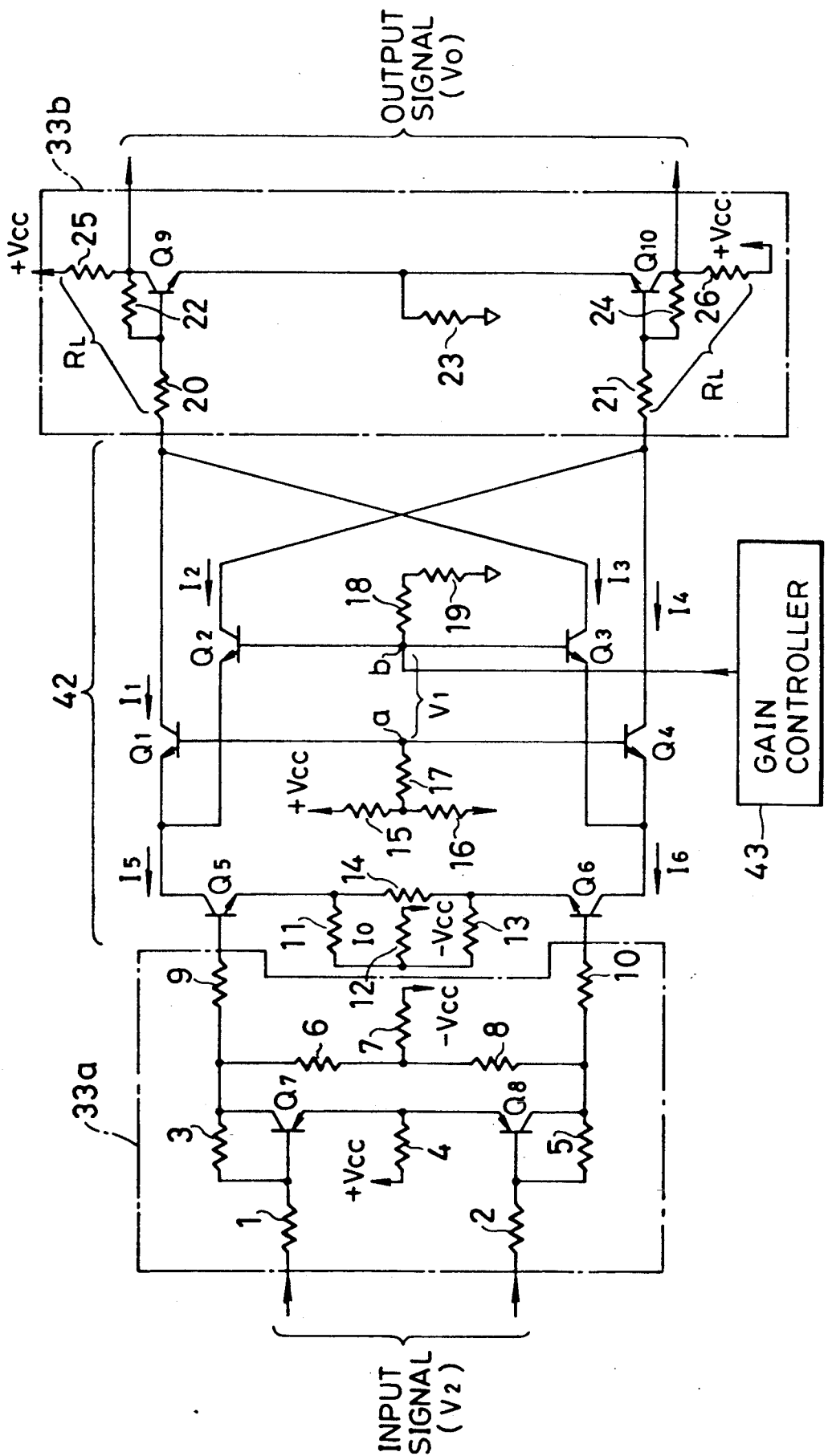
FIG. 4 is a circuit diagram showing an arrangement of a vertical amplifier of FIG. 2.

FIG. 4 is a circuit diagram showing an embodiment of a vertical amplifier with a beam-finding function according to the present invention. In this figure, reference numerals 1 to 26 denote resistors; Q1 to Q10 designate transistors, reference numeral 33a denotes a feedback amplifying stage to receive the input signal V2; reference numeral 33b designates a feed back amplifying stage t supply the output signal VO, and reference numeral 43 is a gain controller to supply DC voltage V1 used as a gain control signal or a beam-finder signal. Such an embodiment is applied to each channel of an oscilloscope and the transistors Q1 to Q6 operate in the same way as the prior description with reference to FIG. 3. That is, the equation $Vo=KV1\cdot V2$, where K is a constant, also holds in this embodiment.

When this embodiment is operated as the vertical amplifier 41 with a normal gain, the gain controller 43 supplies a positive control signal to the point b so that the electric potential of the position b is higher than that of the position a by a certain voltage $+Vab$. That is, this embodiment functions as the vertical amplifier which can provide the gain corresponding to the certain voltage $+Vab$.

Next, when this embodiment is operated as the beam-finder circuit, the gain controller 43 supplies a positive control signal to the point b so that the electric potential of the point b is higher than that of the position a by a certain voltage of $+V'ab$. In this case, the certain voltage $+V'ab$ is set as $V'ab<<Vab$. Therefore, this embodiment functions as a beam-finder circuit because the gin sharply decrease. According to the sharp decrease of the gain, the dynamic range is substantially reduced. Thus, when a differential signal is inputted, the wave form of the input signal is displayed in a clamped wave form.

As described hereinbefore, this embodiment makes it easy to achieve the beam-finding function for each channel. This embodiment also provides not only an easy confirmation means for confirming a rough position of an input signal for each channel, but also an identification function to indicate a display position of an input signal for each channel because the gain in the horizontal direction does not decrease.

Furthermore, the convention beam-finder circuit 37 can be obviated, thereby reducing the number of components.

In addition, when the gain controller 43 is made to supply the gate control signal that corresponds to the voltage of $-Vab$ at the position b against the electric potential of the position a, this embodiment functions as a vertical amplifier with the inverting function which works in the same way as the vertical amplifier mentioned hereinbefore.

The present invention has been described in detail with respect to a preferred embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A vertical amplifier apparatus with a beam-finding function for an oscilloscope comprising:
   an analog multiplier for multiplying an input signal to said vertical amplifier by a gain control signal; and
   gain control means for outputting a DC voltage as the gain control signal, said gain control means supplying, in a beam-finding mode, said analog multiplier with the gain control signal whose absolute value is smaller than that of the gain control signal in a normal mode in which an input signal is displayed to be observed.

2. The vertical amplifier apparatus with a beam-finding function for an oscilloscope as claimed in claim 1, wherein said analog multiplier is a doubly balanced differential amplifier.

3. The vertical amplifier apparatus with a beam-finding function for an oscilloscope as claimed in claim 1, wherein said gain control means is connected to a manually operated beam-finder switch, and outputs said gain control signal of a small absolute value when the beam-finder switch is activated 4. The vertical amplifier apparatus with a beam-finding function for an oscilloscope as claimed in claim 1, wherein said vertical amplifier further comprising an input stage amplifier whose output is connected to an input of said analog multiplier, and an output stage amplifier whose input is connected t an output of said analog multiplier.

5. A vertical amplifier apparatus with a beam-finding function for an oscilloscope comprising:
   a plurality of vertical amplifiers, each of which is provided corresponding to each one of multiple channels of said oscilloscope, each of said plurality of vertical amplifiers including:
   an analog multiplier for multiplying an input signal to said vertical amplifier by a gain control signal; and
   gain control means for outputting a DC voltage as the gain control signal, said gain control means supplying, in a beam-finding mode, said analog multiplier with the gain control signal whose absolute value is smaller than that of the gain control signal in a normal mode in which an input signal is displayed to be observed.

6. The vertical amplifier apparatus with a beam-finding function for an oscilloscope as claimed in claim 5, wherein said gain control means is independently provided for each of said multiple channels.

7. The vertical amplifier apparatus with a beam-finding function for an oscilloscope as claimed in claim 5, wherein said analog multiplier is a doubly balanced differential amplifier.

8. The vertical amplifier apparatus with a beam-finding function for an oscilloscope as claimed in claim 6, wherein each said gain control means is connected to a manually operated beam-finder switch, and output said gain control signal of a small absolute value when the beam-finder switch is activated.

9. The vertical amplifier apparatus with a beam-finding function for an oscilloscope as claimed in claim 5, wherein said vertical amplifier further comprising an input stage amplifier whose output is connected to an input of said analog multiplier, and an output stage amplifier whose input is connected to an output of said analog multiplier.

* * * * *

UNITED STATES PATENT AND TRADEMARK OFFICE
CERTIFICATE OF CORRECTION

PATENT NO. : 5,138,239
DATED : August 11, 1992
INVENTOR(S) : Masao Izawa et al

It is certified that error appears in the above-indentified patent and that said Letters Patent is hereby corrected as shown below:

On the title page, In the Abstract, line 10, after "makes" change "is" to --it--

Claim 4, Column 6, line 23, before "an" change "t" to --to--

Claim 8, Column 6, line 51, change "output" to --outputs--

Signed and Sealed this

Fourteenth Day of December, 1993

Attest:

BRUCE LEHMAN

Attesting Officer     Commissioner of Patents and Trademarks